United States Patent [19]

Griffith

[11] Patent Number: 4,981,941

[45] Date of Patent: Jan. 1, 1991

[54] FLUORINATED EPOXY RESINS WITH HIGH GLASS TRANSITION TEMPERATURES

[75] Inventor: James R. Griffith, Riverdale Heights, Md.

[73] Assignee: The United States of America as represented by the Secretary of the Navy, Washington, D.C.

[21] Appl. No.: 329,227

[22] Filed: Mar. 27, 1989

[51] Int. Cl.$^5$ .................. C08G 59/30; C08G 59/42
[52] U.S. Cl. ............................ 528/93; 528/88; 528/89; 528/90; 528/92; 528/115; 528/365
[58] Field of Search ............ 528/115, 365, 102, 88, 528/89, 90, 92, 93

[56] References Cited

U.S. PATENT DOCUMENTS

| | | | |
|---|---|---|---|
| 3,324,081 | 6/1967 | Barie et al. ............... | 528/115 X |
| 3,344,096 | 9/1967 | Manasia et al. ........... | 528/115 X |
| 3,388,185 | 6/1968 | Goldberg et al. ......... | 528/115 X |
| 4,045,408 | 8/1977 | Griffith . | |
| 4,180,607 | 12/1979 | Sasaki et al. .............. | 528/115 X |
| 4,371,688 | 2/1983 | Moore ....................... | 528/115 X |
| 4,517,372 | 5/1985 | Tang . | |
| 4,533,713 | 8/1985 | Howells . | |
| 4,591,627 | 5/1986 | Maruno et al. . | |
| 4,637,939 | 1/1987 | Maruno et al. . | |
| 4,709,056 | 11/1987 | Cotter et al. . | |
| 4,755,783 | 7/1988 | Fleischer et al. . | |

OTHER PUBLICATIONS

Some New Florinated Epoxies and Polymeric Derivatives, J. of Paint Technology, vol. 43 (552), Jan. 1971.
New Fluoro-Anhydride Curing Agents for Heavily Fluorinated Epoxy Resins, American Chemical Society-173rd Meeting, vol. 137 (1), Mar. 1977.
Fluorinated Epoxy Resins, Chemtech, May 1972.

*Primary Examiner*—Earl Nielsen
*Attorney, Agent, or Firm*—Thomas E. McDonnell; Barry A. Edelberg

[57] ABSTRACT

Fluoroepoxy resins for use in computer composite circuit boards. A "glass state" curing agent containing a fluorinated monoanhydride, a fluorinated dianhydride and a catalyst is compounded at a temperature of about 210° C. The curing agent is blended with di- and trifunctional epoxy resins at 100° C. or higher to give homogeneous fast-curing syrups. Fluoroepoxy resins inherently have low dielectric constants. This method produces a fluoroepoxy resin with higher crosslink densities and higher glass transition temperatures.

25 Claims, No Drawings

FLUORINATED EPOXY RESINS WITH HIGH GLASS TRANSITION TEMPERATURES

BACKGROUND OF THE INVENTION

1. FIELD OF THE INVENTION

This invention relates, generally, to epoxy resins, and, specifically, to fluoroepoxy resins with high glass transition temperature for use in computer composite circuit boards and to a method of making a fluoroepoxy resin with high glass transition temperature.

2. DESCRIPTION OF THE PRIOR ART

Epoxy resins, on account of their superior strength, stability and low surface energy are important today as coatings and adhesives. Difficulties in the manufacture and use of these compounds, especially the highly fluorinated epoxy resins, are caused by the curing agents. The curing agents used in synthesizing high glass transition temperature ($T_g$) epoxy resins are usually dianhydrides, e.g. pyromellitic dianhydride and amines, e.g. dimethylaminoethane. The defects associated with dianhydride curing agents are high melting point, e.g., the melting point of pyromellitic dianhydride is 286° C., very unagressive reaction behavior with these epoxies, and a reduction of the fluorine content of the resin in comparison with the fluorinated epoxy monomer.

While the amine curing agents react more readily, these compounds are not better in regards to the high melting point and reduction of the fluorine content of the resin. These compounds are also objectionable due to the lower thermal stability and coloring of the resulting resins. Fluorinated amines give some improvement. However, these curing agents have several disadvantages which include poor long-term chemical stability, unagressive reaction behavior with respect to epoxies and excessive cost factors.

U.S. Pat. No. 4,045,408 relates to a fluorinated anhydride curing agent for fluoroepoxy resins. Polymethyl benzene is reacted with perfluoroacetone. The fluorosubstituted polymethyl benzene reaction product is oxidized to the acid. The acid is heated to form the anhydride curing agent. Gel times are in hours.

U.S. Pat. No. 4,744,783 describes inductive devices formed by making a circuit pattern on a flexible dielectric substrate and then rolling the patterned substrate into one or more coils such that the current is traveling in the same direction. The device is attached to a printed wiring board. One material suggested for the substrate of the inductive device, but not the printed wiring board, is a fluoropolymeric film. No specific substance is specified. No properties or advantages of using a fluoropolymer are noted.

The drive for high computational speeds has pushed the size of integrated circuits to smaller and smaller dimensions. Lower dielectric constant laminating resins have become necessary to preserve electronic performance. Fluoroepoxy resins inherently have low dielectric constants. However, current resin systems cannot produce material with glass transition temperatures to withstand processing and operating temperatures.

SUMMARY OF THE INVENTION

Accordingly, an object of this invention is to provide a fluoroepoxy resin with a high glass transition temperature.

And, an object of this invention is to provide a fluoroepoxy resin for use in computer composite circuit boards.

Also, an object of this invention is to provide a fluoroepoxy resin which will withstand a processing temperature of 250° C. and an operating temperature of 100° C.

Further, an object of this invention is to provide a curing agent for epoxy resins which will increase the glass transition temperature of these resins.

These and other objects are accomplished by a "glassy state" curing agent containing a monoanhydride and a dianhydride which when mixed with an epoxy resin produces a polymer with higher crosslink densities, resulting in higher glass transition temperatures.

DESCRIPTION OF THE PREFERRED EMBODIMENT

A curing agent containing a monoanhydride and a dianhydride is compounded under heat and cools into a "glassy state", that is, noncrystalline. The purpose of the monoanhydride in the curing agent is to lower the melting point of monoanhydride/dianhydride physical solution and to facilitate blending with the resin.

The general formula of a monoanhydride useful in this invention is shown below:

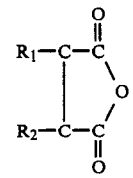

where $R_1$ and $R_2$ are H, an aliphatic group of less than 10 carbon atoms or a substituted aliphatic group of less than 10 carbon atoms, or where $R_1$, $R_2$ and the carbon atoms of the monoanhydride to which they are attached are components of a cyclic ring of less than 6 carbon atoms, a substitute, cyclic ring of less than 6 carbon atoms, a benzene ring or substituted benzene ring.

While it is recognized that the groups listed could have more carbon atoms than that indicated and still be operable in the invention, the named limits in this application are the practical alternatives. Further, by the word "substituted", it is meant in this application that any known substituent could be used to change the named groups. Substituents include but are not limited to halogens, chalcogens and organic radicals, such as phenyl, alcohol, carboxyl, carbonyl, or aliphatic groups of less than 10 carbon atoms.

Preferred monoanhydrides useful in this invention are shown below:

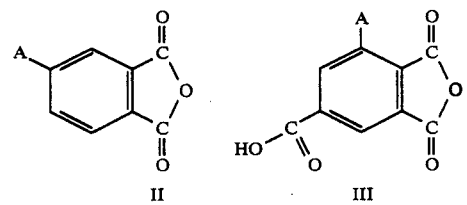

where A is H, an alcohol of 5 carbon atoms or less, a fluorinated alcohol of 5 carbon atoms or less, an aliphatic group of 5 carbon atoms or less, a fluorinated aliphatic group of 5 carbon atom or less, an ester of 5 carbon atoms or less, a fluorinated ester of 5 carbon atoms or less, an ether or 5 carbon atoms or less, a fluorinated ether of 5 carbon atoms or less, a ketone of 5 carbon atom or less or a fluorinated ketone or 5 carbon atoms or less.

The most preferred monoanhydrides useful in this invention are fluorinated monoanhydrides. The general formula of fluorinated monoanhydrides useful in this invention are shown below:

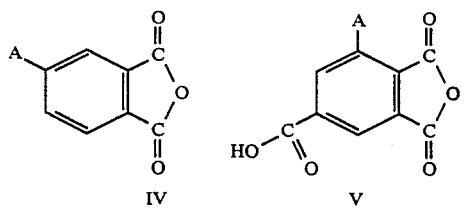

IV    V where A is a fluorinated alcohol cf 5 carbon atoms or less, a fluorinated aliphatic group of 5 carton atom or less, a fluorinated ester of 5 carbon atoms or less, a fluorinated ether of 5 carbon atoms or less, a fluorinated ketone or 5 carbon atoms or less.

Examples of specific fluorinated monoanhydrides of this invention are shown below:

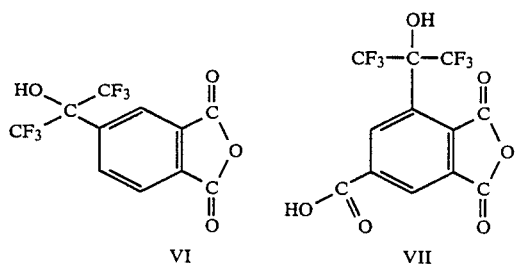

VI    VII

The purpose of the dianhydride in the curing agent is to increase the crosslink density of the resin. However, a curing agent of dianhydride alone would not form a homogeneous mixture with the resin. The general formula of a dianhydride useful in this invention is shown below:

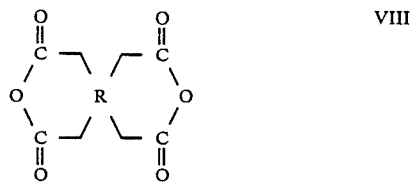

VIII where R is a cyclic ring of less that six carbon atoms, a substituted cyclic ring of less than six carbon atoms, a phenyl radical, a substituted phenyl radical, a diphenyl radical, a substituted diphenyl radical (as substituted was defined earlier).

Preferred dianhydrides useful in this invention are shown below:

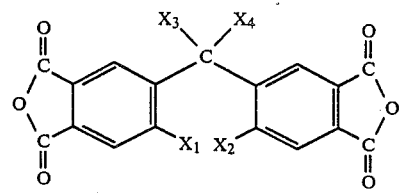

IX

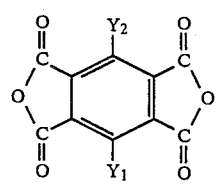

X where $X_1$, $X_2$, $X_3$ and $X_4$ are H, $CF_3$, an aliphatic group of 5 carbon atoms or less or a fluorinated aliphatic group of 5 carbon atoms or less and $Y_1$ and $Y_2$ are H, an alcohol of 5 carbon atoms or less, a fluorinated alcohol of 5 carbon atoms or less, an ester of 5 carbon atoms or less, a fluorinated ester of 5 carbon atoms or less, an ether of 5 carbon atoms or less, a fluorinated ether of 5 carbon atoms of less, an aliphatic group of 5 carbon atoms or less or a fluorinated aliphatic group of 5 carbon atoms or less.

The most preferred dianhydrides useful in this invention are fluorinated dianhydrides. The general formula of fluorinated dianhydrides useful in this invention are shown below:

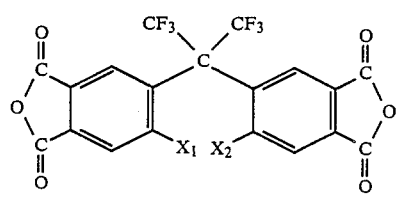

XI

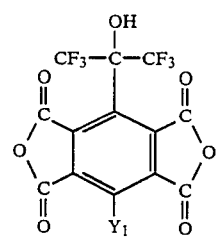

XII where $X_1$ and $X_2$ is H, $CF_3$, an aliphatic group of 5 carbon atoms or less or a fluorinated aliphatic group of 5 carbon atoms or less and $Y_1$ are H, an alcohol of 5 carbon atoms or less, a fluorinated alcohol of 5 carbon atoms or less, an ester of 5 carbon atoms or less, a fluorinated ester of 5 carbon atoms or less, an ether of 5 carbon atoms or less, a fluorinated ether of 5 carbon atoms of less, an aliphatic group of 5 carbon atoms or less or a fluorinated aliphatic group of 5 carbon atoms or less.

Examples of specific fluorinated dianhydrides of this invention are shown below:

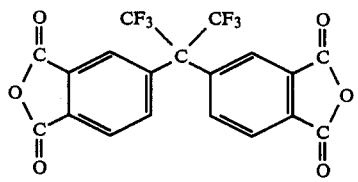

XIII

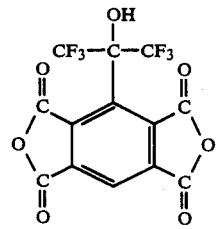

XIV

A catalyst can be added to accelerate the reaction of the curing agent with the resin. Any known catalyst useful in as an accelerator for an epoxy resin/anhydride formulation, such as quaternary ammonium salts, tertiary amines, heavy metal salts, organophosphorus compounds, sulfur-containing rubber vulcanizing agents, thioglycols, phenols, metal chelates containing epoxy groups, arsines, stibines, bismuthines, chlorine-containing amides and sodium salts of carboxylic acids, is useful in this invention. The preferred catalysts useful with the preferred monoanhydrides and dianhydrides are quaternary ammonium salts, such as hexyl trimethyl ammonium chloride, cetyl trimethyl ammonium chloride, cetyl trimethyl ammonium bromide or benzyl trimethyl ammonium chloride, tertiary amines, such as dimethyl benzyl amine, heavy metal salts, such as tin octoate and organophosphorus compounds, such as triphenyl phosphorous oxide. The most preferred catalyst useful with the most preferred monoanhydrides and dianhydrides is the quaternary ammonium salts, specifically hexyl trimethyl ammonium chloride.

For use in high $T_g$ resins, the curing agent contains a monoanhydride, a dianhydride and a catalyst (if desired), compounded at a temperature in the range from 190° C. to 220° C. The preferred temperature range is from 200° C. to 215° C. The most preferred temperature is 210° C.

The minimum amount of monoanhydride is 10 per cent by weight of the curing agent. The dianhydride may be eliminated all together, resulting in a curing agent of 100% monoanhydride. The resulting $T_g$ for a resin system using a 100% monoanhydride curing agent would be less than that for a resin system which uses a monoanhydride-dianhydride curing agent but would still be acceptable for applications. Increasing the amount of dianhydride in the curing agent increases the $T_g$.

The preferred amount of monoanhydride is in the range from a 1:1 molecular ratio to a 3:1 molecular ratio between the monoanhydride and the dianhydride. The most preferred amount is a 2:1 molecular ratio between the monoanhydride and the dianhydride.

The amount of catalyst can vary from none to 0.1 per cent by weight of the curing agent. The advantage of using catalyst is an increase in strength and modulus of the material, but a disadvantage is the shortened working time for gelation. The gelation of a catalyzed reaction can be controlled by dissolving an uncatalyzed curing agent/resin blend in a solvent, such as acetone, then mixing the solution with a catalyst in a solvent, again such as acetone. The solvent can be evaporated to yield a homogeneous resin which can be gelled at a temperature in the range from 125° C. to 175° C. The preferred temperature range is from 140° C. to 160° C. The most preferred temperature is 150° C.

The high $T_g$ curing agent is blended with di- and trifunctional epoxy resins at a temperature in the range from 155° C. to 210° C. to give homogeneous fast-curing syrups. The preferred temperature range is from 160° C. to 190° C. The most preferred temperature is 170° C.

The amount of curing agent is in the range from 50% to 120% of the stoichiometric amount. The preferred amount of curing agent is from 60% to 100% of the stoichiometric amount. The most preferred amount of curing agent is 80% of the stoichiometric amount.

The resin system is cured at a temperature in the range from 200° C. to 220° C. and at a time in the range from 3 hours to 8 hours. The preferred temperature range is from 210° C. to 215° C. and the preferred time is from 4 hours to 6 hours. The most preferred cure is at a temperature of about 215° C. for about 5 hours.

Any epoxy resin will have improved $T_g$ when the curing agent defined above is used in the resin system. Examples of epoxy resins useful with the curing agent of this invention have the backbone structure shown below:

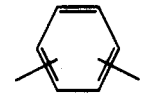   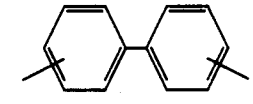

XV                XVI

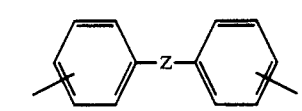   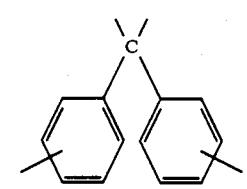

XVII              XVIII

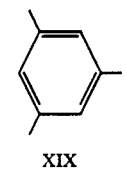

XIX where Z is $SO_2$, an aliphatic group of 5 carbon atoms or less, a substituted aliphatic group of 5 carbon atoms or less, a cyclic ring of 6 carbon atoms or less, a substituted cyclic ring of 6 carbon atoms or less.

Fluoroepoxy resins inherently have low dielectric constants which is a desirable property for computer composite circuit boards. The dielectric constants for fluoroepoxy resins are in the range of 2–3. Difunctional fluoroepoxy resins useful in this invention are shown below:

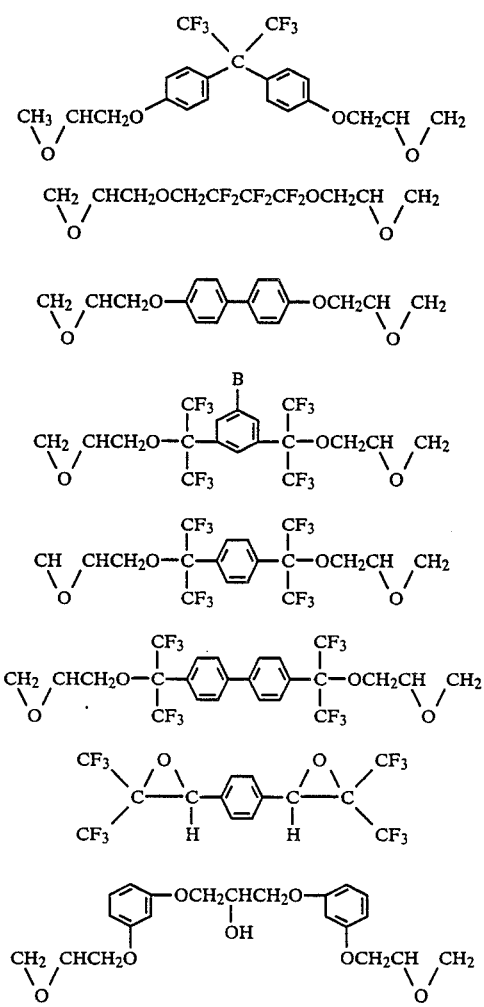

where $C_0$ is defined as when B is H and $C_1$ through $C_{16}$ is defined as when B is $(CF_2)_nCF_3$ and n is 0 through 15, respectively.

A trifunctional fluoroepoxy resins useful in this invention is shown below:

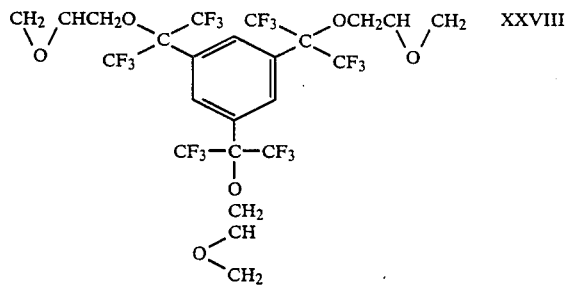

Gel times for this resin system are in minutes for a catalyzed reaction. This curing agent produces a fluoroepoxy resin with higher crosslink densities and higher glass transition temperatures. The curing agent should perform in an identical manner with epoxy resins not containing fluorine and result in higher glass transition temperature for any epoxy resin.

The invention having been generally described, the following examples are given as particular embodiments of the invention and to demonstrate the practice and advantages thereof. It is understood that the examples are given by way of illustration and are not intended to limit the specification or the claims to follow in any manner.

EXAMPLE I

A solution of 3.14 grams of monoanhydride as shown in Illustration VI and 2.22 grams of dianhydride as shown in Illustration XIII was prepared in a test tube with a small stirring bar. The test tube was immersed in a silicone oil bath at 210° C. The solution was stirred for 5 minutes to obtain homogeneity. To the hot solution 0.03 grams of cetyl trimethyl ammonium chloride was added. A greenish transparent solution was formed. The test tube was removed from the oil bath and allowed to cool and form a brittle "glassy" material at room temperature.

EXAMPLE II

In a small test tube 0.57 grams of the mixture formed in Example I was placed. To this mixture 0.69 grams of $C_0$ fluoroepoxy resin was added. A small stirring bar was also placed into the test tube. The test tube was dipped into silicone oil bath at 210° C. The material in the test tube was stirred until a homogeneous solution was obtained at which time the test tube was removed from the bath. The stirring bar was extracted. A spontaneous, continuous reaction was in evidence by a light brown color which developed in the middle of the resin. After five minutes the resin was returned to the silicone oil bath. The was no further flow or obvious liquefaction at this temperature. The sample was cured at 215° C. for 5 hours yielding a reddish brown transparent glassy material. $T_g$ was 209° C.

EXAMPLE III

Into a small test tube 0.50 grams of the mixture formed in Example I was placed. To this mixture 0.58 grams of the trifunctional epoxy shown in FIG. 6 was added. A small stirring bar was also placed in the test tube. The test tube was dipped into silicone oil bath at 210° C. The material in the test tube was stirred until a clear and homogeneous solution was obtained at which time the test tube was removed from the bath. The behavior of the solution was similar to that of Example II, i.e., browning upon being removed from the oil bath. The solution solidified upon setting. The sample was cured at 215° C. for 5 hours yielding a reddish brown transparent glassy material. $T_g$ was 249° C.

EXAMPLE IV $C_0$ fluoroepoxy and an 80% stoichiometric amount of the anhydride mixture of Example I were mixed in a test tube and placed into 170° C. oil bath. A precipitate appeared which was believed to be the dianhydride. Over a 20 minute period the temperature drifted to 176° C. and the precipitate dissolved back into solution. After a 35 period gelation had apparently not occurred. The stirrer was turning freely and the solution was nearly transparent. About 10 milligrams of hexyl trimethyl ammonium chloride was added. The stirrer froze in two minutes, indicating gelation.

EXAMPLE V $C_0$ fluoroepoxy, an 80% stoichiometric amount of the anhydride mixture of Example I and about 10 milligrams of hexyl trimethyl ammonium chloride were mixed in a test tube and placed into 175° C. oil bath. A precipitate appeared and dissolved back into solution in 4 minutes. After 10 minutes the stirrer froze, indicating gelation.

EXAMPLE VI $C_0$ fluoroepoxy and an 80% stoichiometric amount of the anhydride mixture of Example I were mixed in a test tube and placed into 210° C. oil bath. A precipitate appeared for about 45 seconds. After 20 minutes no gelation had occurred. About 10 milligrams of benzyl trimethyl ammonium chloride dissolved in mixture of Example I was added to the solution. Within 2 minutes the stirrer had frozen, indicating gelation had occurred.

EXAMPLE VII

In a small test tube 0.69 grams of $C_0$ fluoroepoxy and 0.46 grams of the mixture formed in Example I were mixed and placed into a 180° C. oil bath. Bath temperature decreased over 10 minutes to 155° C. where precipitation began. The mixture became homogeneous again when the temperature was raised to 170° C. over a 20 minute period.

EXAMPLE VIII

In a small test tube 0.11 grams of the mixture formed in Example I was mixed with about 10 milligrams of benzyl trimethyl ammonium chloride and heated to form a homogeneous mixture. The test tube was placed in tap water and the mixture became "glassy". A sample of this material was dissolved in acetone without any precipitate forming. This solution was used to produce a prepreg with glass cloth.

EXAMPLE IX

Trigycidyl ether was mixed with dianhydride in the ratio of Example III and put in a 180° C. oil bath. Precipitation occurred and did not clear for 45 minutes. At this time the stirrer was moving sluggishly. The solution was removed from the heat and formed a gum at room temperature. This material dissolved in an equal volume of acetone with no immediate precipitation nor was there any precipitation within 3 hours. An equal volume of an acetone solution saturated with trixethyl hexyl ammonium chloride was added and stirred until homogeneous. This solution gave no precipitation. When poured into a small planchet the acetone evaporated to yield a clear homogeneous resin which gelled at 150° C. and cured at 185° C.

EXAMPLE X $C_3$ fluoroepoxy resin, an 80% stoichiometric amount of the anhydride mixture of Example I and approximately 10 milligrams of catalyst were mixed and put into an oil bath at 185° C. There was a brief cloudiness which cleared quickly to a clear homogeneous solution. The stirring bar froze after two minutes, indicating gelation had occurred. The material was cured for 5 hours at 215° C. $T_g$ was 155° C.

Lower dielectric constant laminating resins are necessary to preserve electrical performance as components and circuit boards become smaller. Fluoropolymers with their intrinsically low dielectric constants are one of the few materials meeting these requirements but problems have occurred with fluoropolymers at the processing and operating temperatures of circuit boards. The high glass transition temperatures of the material of this invention overcome the previous stumbling block to the use to fluoropolymers for the use in computer composite circuit boards.

Obviously, numerous modifications and variations of the present invention are possible in light of the above teachings. It is therefore to be understood &:hat within the scope of the appended claims, the invention may be practiced otherwise than as specifically described herein.

What is claimed as new and desired to be secured by letter of patent of the U.S. is:

1. An epoxy resin system comprising:
an epoxy resin;
a noncrystalline curing agent, comprising:
a dianhydride of the general formula

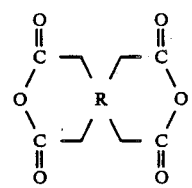

where R is a cyclic ring of less that six carbon atoms, a substituted cyclic ring of less than six carbon atoms, a phenyl radical, a substituted phenyl radical, a diphenyl radical or a substituted diphenyl radical, in solid solution with
a monoanhydride of the general formula

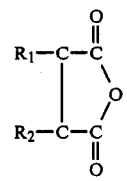

where $R_1$ and $R_2$ are H, an aliphatic group of less than 10 carbon atoms or a substituted aliphatic group of less than 10 carbon atoms, or where $R_1$, $R_2$ and the carbon atoms of the monoanhydride to which they are attached are components of a cyclic ring of less than 6 carbon atoms, a substituted cyclic ring of less than 6 carbon atoms, a benzene ring or a substituted benzene ring.

2. An epoxy resin system as recited in claim 1 wherein the noncrystalline curing agent additionally comprises a catalyst in solid solution therewith.

3. An epoxy resin system as recited in claim 2 wherein the epoxy resin is an epoxy resin having a backbone structure selected from the group consisting of:

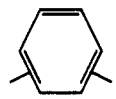

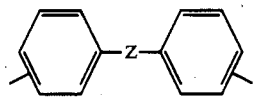

-continued

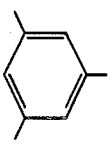

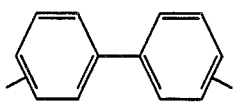

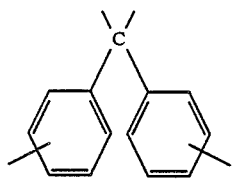

where Z is SO$_2$, an aliphatic group of 5 carbon atoms or less, a substituted aliphatic group of 5 carbon atoms or less, a cyclic ring of 6 carbon atoms or less or a substituted cyclic ring of 6 carbon atoms or less.

4. An epoxy resin system as recited in claim 3 wherein the the epoxy resin is a fluoroepoxy resin.

5. An epoxy resin system as recited in claim 4 wherein the fluoroepoxy resin is selected from the group consisting of

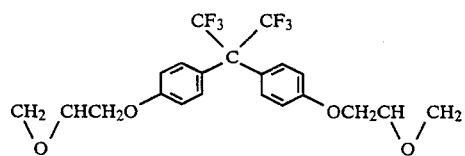

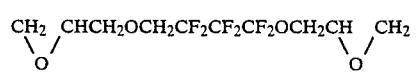

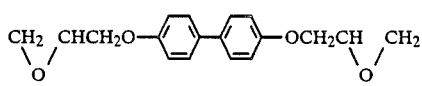

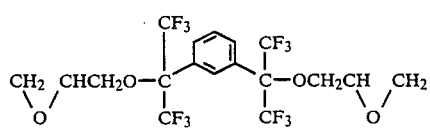

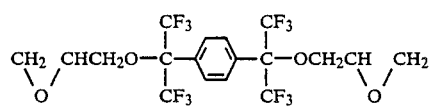

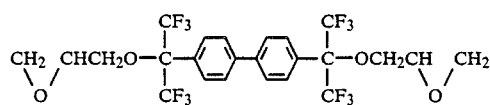

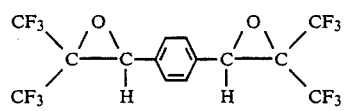

-continued

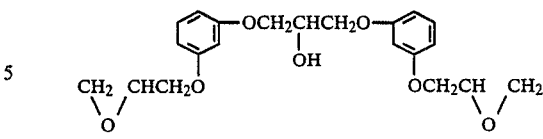

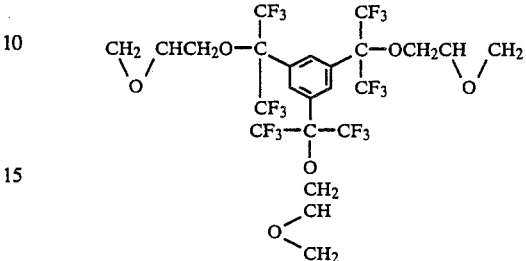

where, $C_0$ is defined as when B is hydrogen, and $C_1$ through $C_{16}$ is defined as when B is $(CF_2)_n CF_3$ and n is 0 through 15, respectively.

6. An epoxy resin system as recited in claim 5 wherein the monoanhydride is a fluorinated monoanhydride.

7. An epoxy resin system as recited in claim 6 wherein the fluorinated monoanhydride is chosen from the group consisting of the following:

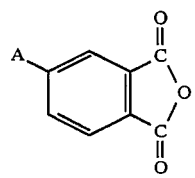

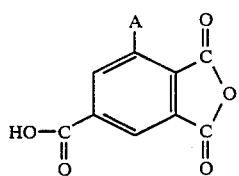

where A is a fluorinated alcohol of 5 carbon atoms or less, a fluorinated aliphatic group of 5 carbon atom or less, a fluorinated ester of 5 carbon atoms or less, a fluorinated ether of 5 carbon atoms or less, a fluorinated ketone or 5 carbon atoms or less.

8. An epoxy resin system as recited in claim 7 wherein the fluorinated monoanhydride is

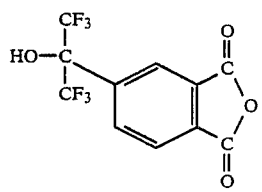

9. An epoxy resin system as recited in claim 8 wherein the dianhydride is a fluorinated dianhydride.

10. An epoxy resin system as recited in claim 9 wherein the fluorinated dianhydride is chosen from the group consisting of the following:

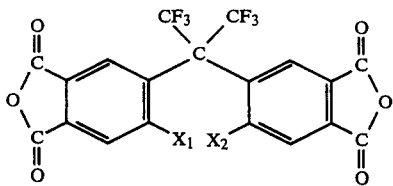

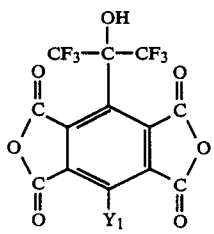

where $X_1$ and $X_2$ are H, $CF_3$, an aliphatic group of 5 carbon atoms or less or a fluorinated aliphatic group of 5 carbon atoms or less and $Y_1$ is H, an alcohol of 5 carbon atoms or less, a fluorinated alcohol of 5 carbon atoms or less, an ester of 5 carbon atoms or less, a fluorinated ester of 5 carbon atoms or less, an ether of 5 carbon atoms or less, a fluorinated ether of 5 carbon atoms of less, an aliphatic group of 5 carbon atoms or less or a fluorinated aliphatic group of 5 carbon atoms or less.

11. An epoxy resin system as recited in claim 10 wherein the fluorinated dianhydride is

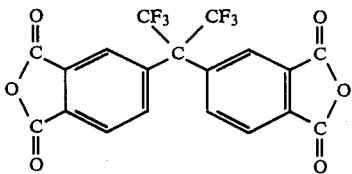

12. An epoxy resin system as recited in claim 11 wherein the catalyst is chosen from the group consisting of quaternary ammonium salts, tertiary amines, heavy metal salts, organophosphorus compounds, sulfur-containing rubber vulcanizing agents, thioglycols, phenols, metal chelates containing epoxy groups, arsines, stibines, bismuthines, chlorine-containing amides and sodium salts of carboxylic acids.

13. An epoxy resin system as recited in claim 12 wherein the catalyst is chosen from the group consisting of quaternary ammonium salt catalyst, tertiary amines, heavy metal salts, and phosphorus compounds.

14. An epoxy resin system as recited in claim 13 wherein the catalyst is a quaternary ammonium salt catalyst chosen from the group consisting of hexyl trimethyl ammonium chloride, cetyl trimethyl ammonium chloride, cetyl trimethyl ammonium bromide and benzyl trimethyl ammonium chloride.

15. An epoxy resin system as recited in claim 14 wherein the catalyst is hexyl trimethyl ammonium chloride.

16. A method of making a resin comprising:
forming a curing agent by compounding a fluorinated monoanhydride and a fluorinated dianhydride at a temperature in the range from 190° C. to 220° C.,
blending the curing agent with epoxy resins at a temperature in the range from 155° C. to 210° C.,
curing resin at a temperature in the range from 200° C. to 220° C. for a time in the range from 3 hours to 8 hours.

17. A method as recited in claim 16 wherein additionally a catalyst is compounded with the fluorinated monanhydride and the fluorinated dianhydride.

18. A method as recited in claim 17 wherein the forming of the curing agent is at a temperature of about 210° C.

19. A method as recited in claim 18 wherein the blending of the curing agent and epoxy resin is at a temperature of about 170° C.

20. A method as recited in claim 19 wherein the curing is at a temperature of about 215° C. at a time of about 5 hours.

21. A method as recited in claim 16 wherein additionally after blending the curing agent with epoxy resins:
dissolving the curing agent/resin blend in an equal volume of solvent,
mixing the curing agent/resin/solvent solution into an equal volume of an solvent saturated with a catalyst,
stirring the solution until a homogeneous blend is obtained,
evaporating the solvent from the solution to leave the resin, and
gelling the resin at a temperature in the range from 125° C. to 175° C. before curing.

22. An epoxy resin system as recited in claim 1, wherein the molecular ratio of said monoanhydride to said dianhydride is from about 1:1 to about 3:1.

23. An epoxy resin system as recited in claim 1, wherein the curing agent is formed by compounding said monoanhydride and said dianhydride under heat and then cooling the resultant produce to a glassy state.

24. The resin system of claim 23, wherein said compounding is performed in the presence of a catalyst for curing said epoxy resin.

25. The resin system of claim 23, wherein said compounding is performed at a temperature of from 190° C. to 220° C.

* * * * *